US006265459B1

(12) United States Patent
Mahoney et al.

(10) Patent No.: US 6,265,459 B1
(45) Date of Patent: *Jul. 24, 2001

(54) ACCELERATORS USEFUL FOR ENERGY POLYMERIZABLE COMPOSITIONS

(75) Inventors: Wayne Scott Mahoney, Saint Paul; Peggy Sperl Willett, Stillwater, both of MN (US)

(73) Assignee: 3M Innovative Properties Company, Saint Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/223,926

(22) Filed: Dec. 31, 1998

(51) Int. Cl.[7] ............................ C08F 4/72; C08F 2/50; C08F 2/38

(52) U.S. Cl. ............................ 522/17; 522/18; 522/22; 522/27; 522/28; 522/29; 522/129; 522/146; 522/170; 522/179; 528/15; 528/12; 528/408; 528/412

(58) Field of Search .................... 522/17, 18, 22, 522/27, 28, 29, 129, 146, 170, 179; 528/12, 15, 408, 412

(56) References Cited

U.S. PATENT DOCUMENTS

| 3,907,706 | 9/1975 | Robins | 252/431 |
|---|---|---|---|
| 4,297,458 | * 10/1981 | Stark, Jr. | 525/507 |
| 4,503,211 | 3/1985 | Robins | 528/92 |
| 4,677,137 | 6/1987 | Bany et al. | 522/31 |
| 4,788,235 | 11/1988 | Johnson | 523/451 |
| 4,868,288 | 9/1989 | Meier | 534/15 |
| 5,059,701 | 10/1991 | Keipert | 556/13 |
| 5,073,476 | 12/1991 | Meier et al. | 430/280 |
| 5,089,536 | 2/1992 | Palazzotto | 522/16 |
| 5,191,101 | 3/1993 | Palazzotto et al. | 556/47 |
| 5,212,210 | 5/1993 | Halm | 522/24 |
| 5,252,694 | 10/1993 | Willett et al. | 525/404 |
| 5,310,840 | 5/1994 | Willett et al. | 526/273 |
| 5,362,421 | 11/1994 | Kropp et al. | 252/512 |

(List continued on next page.)

FOREIGN PATENT DOCUMENTS

| 094914 | 5/1983 | (EP) . |
|---|---|---|
| 0 340 591 | 4/1989 | (EP) . |
| 661324 | 11/1994 | (EP) . |
| 0 764 690 | 6/1996 | (EP) . |
| 61-36302 | 2/1986 | (JP) . |
| 9-325479 | 12/1997 | (JP) . |
| 93 15124 | 8/1993 | (WO) . |
| 96 21704 | 7/1996 | (WO) . |
| 96 32453 | 10/1996 | (WO) . |

OTHER PUBLICATIONS

McAdams et al, "Epoxy Resins", Encyclopedia of Polymer Science and Engineering, vol. 6, 1986, pp. 322–382.

(List continued on next page.)

Primary Examiner—Susan W. Berman
(74) Attorney, Agent, or Firm—Melanie Gover

(57) ABSTRACT

Accelerators that can be useful for an energy polymerizable composition comprising a cationically curable material; energy polymerizable compositions comprising at least one cationically curable material and an initiation system therefor, the initiation system comprising at least one organometallic complex salt and at least one accelerator; and a method for curing the compositions. The cured compositions can provide useful articles. The invention also provides compositions of matter comprising an organometallic complex salt and at least one compound selected from the Class 1 and Class 2 compounds disclosed herein.

29 Claims, 1 Drawing Sheet

U.S. PATENT DOCUMENTS

| | | | |
|---|---|---|---|
| 5,371,115 | 12/1994 | Meier et al. | 522/13 |
| 5,385,954 | 1/1995 | Palazzotto et al. | |
| 5,494,943 | 2/1996 | Mahoney et al. | 522/66 |
| 5,494,944 | 2/1996 | Meier et al. | 522/18 |
| 5,521,227 | 5/1996 | Palazzotto et al. | |
| 5,554,664 | 9/1996 | Lamanna et al. | 522/25 |
| 5,672,637 | 9/1997 | Mahoney et al. | 522/25 |

OTHER PUBLICATIONS

Wrighton et al, "Preparation of Chemically Derivatized Platinum and Gold Electrode Surfaces, Synthesis, Characterization, and Surface Attachment of Trichlorosilylferrocene", Journal of the American Chemical Society, vol. 100, No. 23 Nov. 8, 1978, pp. 7264–7271.

Hendrickson, D. N., Sohn, Y. S., Gray, H. B., "Magnetic Susceptibility Study of Various Ferricenium and Iron (III) Dicarbollide Compounds", Inorganic Chemistry, vol. 10, No. 8, Aug. 8, 1971, p. 1559–1563.

F. A. Cotton, G. Wilkinson, Periodic Table of Elements, Basic Inorganic Chemistry, John Wiley & Sons, Inc., 1976, p. 497–527.

C. R. Noller, Chemistry of Organic Compounds, $3^{rd}$ Edition, 1966, p. 602.

Markowitz, M., "Controllable reactivity epoxy resin hardeners", Chemical Abstracts, vol. 88, No. 22, May 29, 1978, Columbus Ohio, abstract No. 153433.

\* cited by examiner

ACCELERATORS USEFUL FOR ENERGY POLYMERIZABLE COMPOSITIONS

FIELD OF INVENTION

This invention relates to accelerators that may be useful for energy polymerizable compositions comprising a cationically curable material; energy-polymerizable compositions that comprise a cationically curable material and a two-component initiator system, which initiator system comprises at least one organometallic complex salt and at least one accelerator; and a method for curing the compositions. This invention also relates to preparing articles comprising the cured compositions. In addition to other uses, the compositions are useful as molded articles, as coating compositions including abrasion resistant coatings, as adhesives including structural adhesives, and as binders for abrasives and magnetic media The invention also relates to compositions of matter comprising an organometallic complex salt and at least one compound selected from the Class 1 and Class 2 compounds disclosed herein.

BACKGROUND

Transition metal salts comprising an organometallic cation and a non-nucleophilic counteranion have been shown to have utility as photochemically activated initiators for cationic addition polymerization. These photoinitiator salts include (cyclopentadienyl) (arene) iron$^+$salts of the anions $PF_6^-$ and $SbF_6^-$. Similarly, certain classes of these salts are known to be thermally-activatable curatives for cationic polymerizations.

For many commercial applications, the monomers being polymerized are often multifunctional (i.e., contain more than one polymerizable group per molecule), for example, epoxides, such as diglycidyl ethers of bisphenol A (DGEBA). Mixtures of multifunctional monomers such as epoxides and polyalcohols (polyols) or polyepoxides and polyalcohols can undergo acid-catalyzed polycondensation via a step-growth mechanism. Also included in this description are multireactive monomers—those that comprise two or more classes of reactive groups.

In many applications photoinduced polymerization is impossible, impractical or undesirable. For example, many situations where polymerization reactions occur in a closed environment (i.e., in a mold or in a laminated product) or where polymerizable compositions may contain opacifying pigments, thermally activated initiators are preferred. Thermally-activated initiators, such as known organometallic salts, may be used to initiate polymerization in these cases.

There is a continuing need to be able to modify the rate and temperature of polymerization of energy polymerizable compositions to meet the needs of specific applications.

SUMMARY OF THE INVENTION

The present invention relates to accelerators that may be used to influence the temperature at which the polymerization of an energy polymerizable composition comprising a cationically curable material occurs. In particular, the accelerators of this invention may be used to reduce the polymerization temperature or allow modification of the rate or degree of polymerization at a given temperature of cationically-polymerizable materials when organometallic salt initiators are used in cationic polymerization.

Briefly, in one aspect, this invention provides a method comprising the step of using an accelerator and at least one salt of an organometallic complex cation to increase the rate, or reduce the temperature, of cure of an energy polymerizable composition comprising a cationically curable material, wherein said cation contains at least one carbon atom bonded to a transition metal atom, and wherein said accelerator, or an active portion thereof, comprises at least one compound selected from classes 1 and 2 class 1 comprises compounds represented by Formula III, and class 2 comprises compounds represented by Formula IV.

In another aspect this invention provides an energy polymerizable composition comprising:

(a) at least one cationically curable material;
(b) a two-component initiator system comprising:
   (1) at least one salt of an organometallic complex cation, wherein said cation contains at least one carbon atom bonded to a transition metal atom, and
   (2) at least one accelerator, or an active portion thereof, of classes 1 and 2 wherein class 1 comprises compounds represented by Formula III herein and class 2 comprises compounds represented by Formula IV herein.

In other aspects, the invention provides an energy polymerizable composition with one or more of the following optional components:

(a) at least one of an alcohol-containing material and additional adjuvants;
(b) stabilizing ligands to improve shelf-life;
(c) at least one film-forming thermoplastic oligomeric or polymeric resin essentially free of nucleophilic groups, such as amine, amide, nitrile, sulfur, or phosphorous functional groups or metal-complexing groups, such as carboxylic acid and sulfonic acid; and
(d) coupling agents to modify adhesion.

In another aspect, the invention provides a process for controlling or modifying the cure of a composition comprising the steps of:

(a) providing the energy polymerizable composition of the invention,
(b) adding sufficient energy to the composition in the form of at least one of heat and light, in any combination and order, to polymerize the composition.

In another aspect, this invention provides an article comprising a substrate having on at least one surface thereof a layer of the composition of the invention. The article can be provided by a method comprising the steps:

(a) providing a substrate,
(b) coating the substrate with the curable composition of the invention and, optionally, adjuvants; and
(c) supplying sufficient energy to the composition in the form of at least one of heat and light in any combination and order to polymerize the composition.

In another aspect, this invention provides a composition of matter comprising (1) at least one salt of an organometallic complex cation, wherein said cation contains at least one carbon atom bonded to a transition metal atom, and
(2) at least one compound, or an active portion thereof, from classes 1 and 2 wherein class 1 comprises compounds represented by Formula III herein and class 2 comprises compounds represented by Formula IV herein.

As used in this application:

"energy-induced curing" means curing or polymerization by means of heat or electromagnetic radiation (ultraviolet, visible, or electron beam), or electromagnetic radiation in combination with thermal (infrared and heat) means, such that heat and light are used simultaneously, or in any sequence, for example, heat followed by light, light followed by heat followed by light;

"catalytically-effective amount" means a quantity sufficient to effect polymerization of the curable composition to a polymerized product at least to a degree to cause an increase in viscosity of the composition under the conditions specified;

"organometallic salt" means an ionic salt of an organometallic complex cation, wherein the cation contains at least one carbon atom of an organic group that is bonded to a metal atom of the transition metal series of the Periodic Table of Elements ("Basic Inorganic Chemistry", F. A. Cotton, G. Wilkinson, Wiley, 1976, p. 497);

"initiator" and "catalyst" are used interchangeably and mean at least one salt of an organometallic complex cation that can change the speed of a chemical reaction;

"cationically curable monomer" means at least one epoxide containing or vinyl ether containing material;

"polymerizable composition" or "curable composition" as used herein means a mixture of the initiator system and the cationically curable monomer; alcohols and adjuvants optionally can be present;

"polymerize" or "cure" means to supply sufficient energy to a composition in the form of at least one of heat and light in any order or combination to alter the physical state of the composition, to make it transform from a fluid to less fluid state, to go from a tacky to a non-tacky state, to go from a soluble to insoluble state, or to decrease the amount of polymerizable material by its consumption in a chemical reaction;

"initiation system", "initiator system", or "two-component initiator" means at least one salt of an organometallic complex cation and at least one accelerator, the system being capable of initiating polymerization;

"accelerator" means at least one of specified classes of compounds that moderate the cure of a composition of the invention by reducing the polymerization temperature or allowing an increase of the rate or degree of polymerization at a given temperature;

"epoxy-containing" means a material comprising at least one epoxy and may further comprise accelerating additives, stabilizing additives, fillers, diols, and other additives;

"group" or "compound" or "ligand" means a chemical species that allows for substitution or which may be substituted by conventional substituents which do not interfere with the desired product, e.g., substituents can be alkyl, alkoxy, aryl, phenyl, halo (F, Cl, Br, I), cyano, nitro, etc., and "epoxy/polyol" and "catalyst/additive", etc., mean combinations of the substances on both sides of the slash ("/").

An advantage of at least one embodiment of the present invention is that the initiator system can initiate curing of a thermally- or photo- polymerizable composition at temperatures lower than temperatures required for reactions initiated without the accelerators of the present invention.

Another advantage of at least one embodiment of the invention is that the initiator system can provide enhanced curing of a thermally- or photo- polymerizable composition at a given temperature. For example, at a given temperature, curing time can be reduced as compared to curing times for reactions initiated without the accelerators of the invention.

Yet another advantage of at least one embodiment of the invention is the ability to affect a color change in the curable composition upon activation of a catalyst in the composition or as the composition changes from an uncured to a cured state.

DETAILED DISCLOSURE

Figure 1:
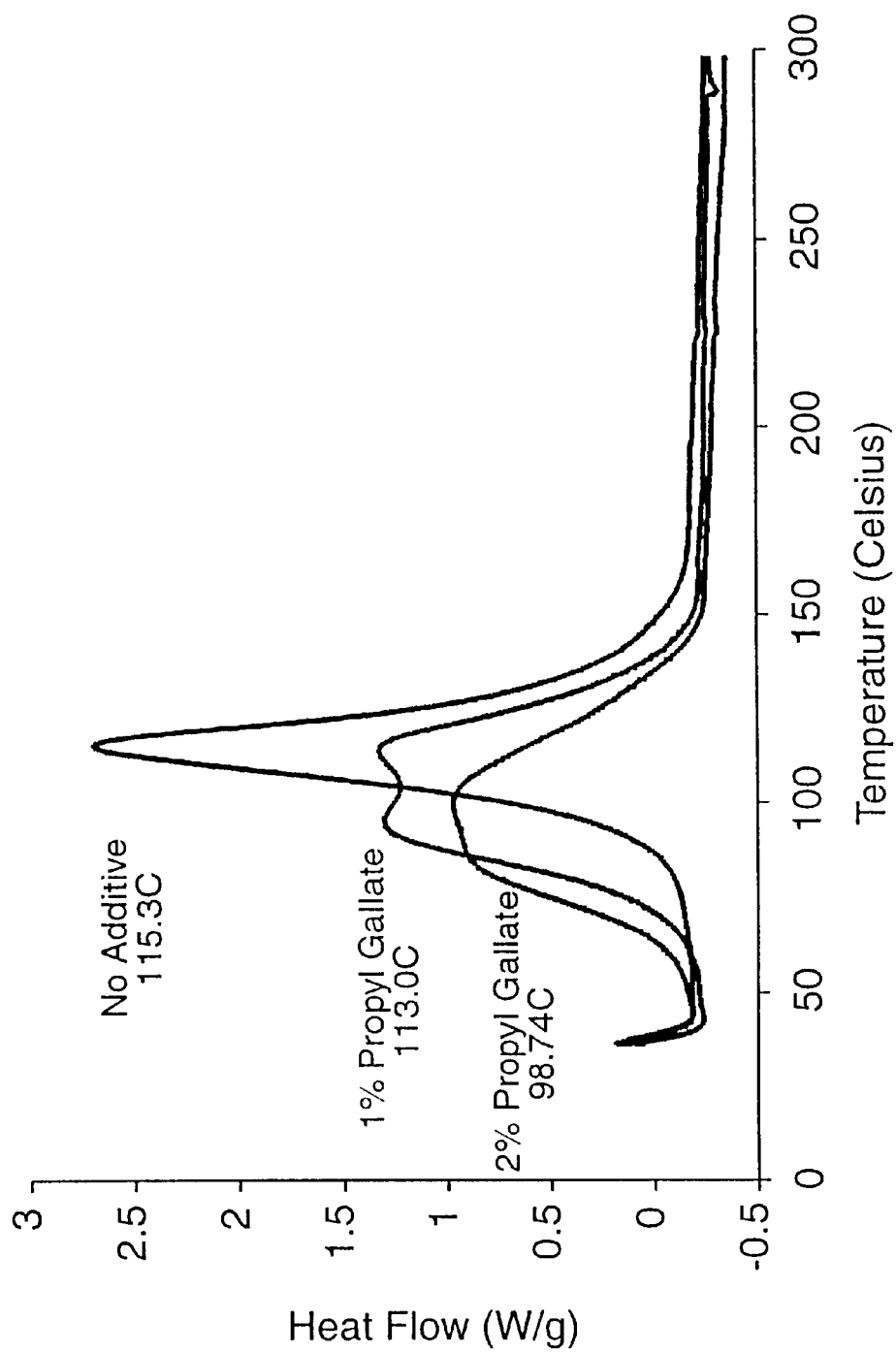
FIG. 1 illustrates the change in onset temperature, peak temperature, end temperature, and total exotherm energy for a composition of the invention comprising an 88:6:6 weight % mixture of EPON 828/1,6-hexanediol/1,4-CHDM cured with a CpFeXylSbF$_6$ catalyst and 0, 1, and 2 weight % of propyl gallate. Peak temperatures of 115.3° C., 113.0° C. and 98.74° C. correspond to propyl gallate weight percents of 0, 1, and 2, respectively.

The present invention provides an energy polymerizable composition comprising at least one cationically-polymerizable material and an initiation system therefor, the initiation system comprising at least one organometallic complex salt and at least one accelerator. The cured composition provides useful articles or coated articles.

Epoxy compounds that can be cured or polymerized by the processes of this invention are those known to undergo cationic polymerization and include 1,2-, 1,3-, and 1,4-cyclic ethers (also designated as 1,2-, 1,3-, and 1,4-epoxides).

See the "Encyclopedia of Polymer Science and Technology", 6, (1986), p. 322, for a description of suitable epoxy resins. In particular, cyclic ethers that are useful include the cycloaliphatic epoxies such as cyclohexene oxide and the ERL series type of resins available from Union Carbide, New York, N.Y., such as vinylcyclohexene oxide, vinylcyclohexene dioxide, 3,4-epoxycyclohexylmethyl-3,4-epoxycyclohexane carboxylate, bis-(3,4-epoxycyclohexyl) adipate and 2-(3,4-epoxycylclo-hexyl-5,5-spiro-3,4epoxy) cyclohexene-meta-dioxane; also included are the glycidyl ether type epoxy resins such as propylene oxide, epichlorohydrin, styrene oxide, glycidol, the EPON series type of epoxy resins available from Shell Chemical Co., Houston, Tex., including the diglycidyl ether of bisphenol A and chain extended versions of this material such as EPON 828, EPON 1001, EPON 1004, EPON 1007, EPON 1009 and EPON 2002 or their equivalent from other manufacturers, dicyclopentadiene dioxide, epoxidized vegetable oils such as epoxidized linseed and soybean oils available as VIKOLOX and VIKOFLEX resins from Elf Atochem North America, Inc., Philadelphia, Pa., epoxidized KRATON LIQUID Polymers, such as L-207 available from Shell Chemical Co., Houston, Tex., epoxidized polybutadienes such as the POLY BD resins from Elf Atochem, Philadelphia, Pa., 1,4-butanediol diglycidyl ether, polyglycidyl ether of phenolformaldehyde, epoxidized phenolic novolac resins such as DEN 431 and DEN 438 available from Dow Chemical Co., Midland Mich., epoxidized cresol novolac resins such as ARALDITE ECN 1299 available from Ciba, Hawthorn, N.Y., resorcinol diglycidyl ether, and epoxidized polystyrene/polybutadiene blends such as the EPOFRIEND resins such as EPOFRIEND A1010 available from Daicel USA Inc., Fort Lee, N.J., and resorcinol diglycidyl ether.

The preferred epoxy resins include the ERL type of resins especially 3,4-epoxycyclohexylmethyl-3,4-epoxycyclohexanecarboxylate, bis-(3,4-epoxycyclohexyl) adipate and 2-(3,4-epoxycylclohexyl-5,5-spiro-3,4-epoxy) cyclohexene-meta-dioxane and the bisphenol A EPON type resins including 2,2-bis-[p-(2,3-epoxypropoxy) phenylpropane and chain extended versions of this material. It is also within the scope of this invention to use a blend of more than one epoxy resin.

It is also within the scope of this invention to use one or more epoxy resins blended together. The different kinds of resins can be present in any proportion.

It is within the scope of this invention to use vinyl ether monomers as the cationically curable material. Vinyl ether-containing monomers can be methyl vinyl ether, ethyl vinyl ether, tert-butyl vinyl ether, isobutyl vinyl ether, triethyleneglycol divinyl ether (RAPI-CURE DVE-3, available from International Specialty Products, Wayne, N.J.), 1,4-cyclohexanedimethanol divinyl ether (RAPI-CURE CHVE, International Specialty Products), trimetylolpropane trivinyl ether (TMPTVE, available from BASF Corp., Mount Olive, N.J.) and the VECTOMR divinyl ether resins from Allied Signal, such as VECTOMER 2010, VECTOMER 2020, VECTOMER 4010, and VECTOMER 4020, or their equivalent from other manufacturers. It is within the scope of this invention to use a blend of more than one vinyl ether resin.

It is also within the scope of this invention to use one or more epoxy resins blended with one or more vinyl ether resins. The different kinds of resins can be present in any proportion.

Bifinctional monomers may also be used and examples that are useful in this invention possess at least one cationically polymerizable functionality or a functionality that copolymerizes with cationically polymerizable monomers, e.g., functionalities that will allow an epoxy-alcohol copolymerizaton.

When two or more polymerizable compositions are present, they can be present in any proportion.

Suitable salts of organometallic complex cations of the initiator system include, but are not limited to, those salts disclosed in U.S. Pat. No. 5,089,536, (col. 2, line 48, to col. 16, line 10), which patent is incorporated herein by reference in its entirety.

In preferred compositions of the invention, the organometallic complex salt of the initiator system is represented by the following formula:

$$[(L^1)_y(L_2)_zM]^{+q}X_n \qquad (I)$$

wherein

M is selected from the group containing Cr, Ni, Mo, W, Mn, Tc, Re, Fe, Ru, Os, Co, Rh and Ir;

$L^1$ represents the same or different ligands contributing pi-electrons that can be selected from aromatic compounds and heterocyclic aromatic compounds, and the ligand is capable of contributing six pi-electrons to the valence shell of M;

$L^2$ represents the same or different ligands contributing pi-electrons that can be selected from cyclopentadienyl and indenyl anion groups, and the ligand is capable of contributing six pi-electrons to the valence shell of M;

q is an integer having a value of 1 or 2, the residual charge of the complex cation;

y and z are integers having a value of zero, one, or two, provided that the sum of y and z is equal to 2;

X is an anion selected from tris-(highly fluorinated alkyl)sulfonyl methide, bis-(highly fluorinated alkyl)sulfonyl imide, tris-(fluorinated aryl)sulfonyl methide, tetrakis-(fluorinated aryl) borate, organic sulfonate anions, and halogen-containing complex anions of a metal or metalloid; and n is an integer having a value of 1 or 2, the number of complex anions required to neutralize the charge q on the complex cation.

Ligands $L^1$ and $L^2$ are well known in the art of transition metal organometallic compounds.

Ligand $L^1$ is provided by any monomeric or polymeric compound having an accessible aromatic group regardless of the total molecular weight of the compound. By "accessible", it is meant that the compound (or precursor compound from which the accessible compound is prepared) bearing the unsaturated group is soluble in a reaction medium, such as an alcohol, e.g., methanol; a ketone, e.g., methyl ethyl ketone; an ester, e.g., amyl acetate; a halocarbon, e.g., trichloroethylene; an alkane, e.g., decalin; an aromatic hydrocarbon, e.g., anisole; an ether, e.g., tetrahydrofuran; or that the compound is divisible into very fine particles of high surface area so that the unsaturated group (that is, the aromatic group) is sufficiently close to the metal to form a pi-bond between that unsaturated group and M. By polymeric compound, is meant, as explained below, that the ligand can be a group on a polymeric chain.

Illustrative of ligand $L^1$ are substituted and unsubstituted carbocyclic and heterocyclic aromatic ligands having up to 25 rings and up to 100 carbon atoms and up to 10 heteroatoms selected from nitrogen, sulfur, non-peroxidic oxygen, phosphorus, arsenic, selenium, boron, antimony, tellurium, silicon, germanium, and tin, such as, for example, $eta^6$-benzene, $eta^6$-mesitylene, $eta^6$oluene, $eta^6$-p-xylene, $eta^6$-o-xylene, $eta^6$-m-xylene, $eta^6$-cumene, $eta^6$-durene, $eta^6$-pentamethylbenzene, $eta^6$-hexamethylbenzene, $eta^6$-fluorene, $eta^6$-naphthalene, $eta^6$-anthracene, $eta^6$- perylene, $eta^6$-chrysene, $eta^6$-pyrene, $eta^6$-triphenylmethane, $eta^6$-paracyclophane, and $eta^6$-carbazole. Other suitable aromatic compounds can be found by consulting any of many chemical handbooks.

Illustrative of ligand $L^2$ are ligands derived from the substituted and unsubstituted $eta^5$-cyclopentadienyl anion, for example, $eta^5$-cyclopentadienyl anion, $eta^5$-methylcyclopentadienyl anion, $eta^5$-pentamethylcyclopentadienyl anion, $eta^5$-trimethylsilylcyclopentadienyl anion, $eta^5$-trimethyltincyclopentadienyl anion, $eta^5$-triphenyltincyclopentadienyl anion, $eta^5$-triphenylsilylcyclopentadienyl anion, and $eta^5$-indenyl anion.

Each of the ligands $L^1$ and $L^2$ can be substituted by groups that do not interfere with the complexing action of the ligand to the metal atom or that do not reduce the solubility of the ligand to the extent that competing with the metal atom does not take place. Examples of substituting groups, all of which preferably have less than 30 carbon atoms and up to 10 hetero atoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, phenyl, benzyl, allyl, benzylidene, ethenyl, and ethynyl; cyclohydrocarbyl such as cyclohexyl; hydrocarbyloxy groups such as methoxy, butoxy, and phenoxy; hydrocarbylnercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, and cyclohexanecarbonyloxy; hydrocarbylcarbonamido, for example, acetamido, benzamido; azo; boryl; halo, for example, chloro, iodo, bromo, and fluoro; hydroxy; cyano; nitro; nitroso; oxo; dimethylamino; diphenylphosphino; diphenylarsino; diphenylstibine; trimethylgermane; tributyltin; methylseleno; ethyltelluro; and trimethylsiloxy.

Ligands $L^1$ and $L^2$ independently can be a unit of a polymer. $L^1$ for example, can be the phenyl group in polystyrene, or polymethylphenylsiloxane; or the carbazole group in polyvinylcarbazole. $L^2$, for example, can be the cyclopentadiene group in poly(vinylcyclopentadiene). Polymers having a weight average molecular weight up to 1,000,000 or more can be used It is preferable that 5 to 50% of the aromatic groups present in the polymer be complexed with metallic cations.

In addition to those described above, suitable anions, X, in Formula I, for use as the counterion in the ionic salts of the organometallic complex cation in the coating compositions are those in which X can be represented by the formula $$DQ_r \quad (II)$$

wherein

D is a metal from Groups IB to VIIB and VIII or a metal or metalloid from Groups IIIA to VA of the Periodic Table of Elements (CAS notation), Q is a halogen atom, hydroxyl group, a substituted or unsubstituted phenyl group, or a substituted or unsubstituted alkyl group, and r is an integer having a value of 1 to 6.

Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen atom, Q, is chlorine or fluorine. Illustrative of suitable anions are $B(phenyl)_4^-$, $B(phenyl)_3(alkyl)^-$, where alkyl can be ethyl, propyl, butyl, hexyl and the like, $BF_4^-$, $PF_6^-$, $AsF_6^-$, $SbF_6^-$, $FeCl_4^-$, $SnCl_5^-$, $SbF_5OH^-$, $AlCl_4^-$, $AlF_6^-$, $GaCl_4^-$, $InF_4^-$, $TiF_6^-$, $ZrF_6^-$, $B(C_6F_5)_4^-$, $B(C_6F_3(CF_3)_2)_4^-$.

Additional suitable anions, X, in Formula I, of use as the counterion in the ionic salts of the organometallic complex cations include those in which X is an organic sulfonate. Illustrative of suitable sulfonate-containing anions are $CH_3SO_3^-$, $CF_3SO_3^-$, $C_6H_5SO_3^-$, p-toluenesulfonate, p-chlorobenzenesulfonate and related isomers. Additional suitable anions include tris-(highly fluorinated alkyl) sulfonyl methide, bis-(highly fluorinated alkyl)sulfonyl imide, tris-(fluorinated aryl)sulfonyl methide, as described in U.S. Pat. No. 5,554,664, which patent is incorporated herein by reference. Preferably, the anions are $BF_4^-$, $PF_6^-$, $SbF_6^-$, $SbF_5OH^-$, $AsF_6^-$, $SbCl_6^-$, $CF_3SO_3^-$, $C(SO_2CF_3)_3^-$, and $N(SO_2CF_3)_2^-$.

Organometallic salts are known in the art and can be prepared as disclosed in, for example, EPO Nos. 094,914, 094,915, 126,712, and U.S. Patent Nos. 5,089,536, 5,059, 701, 5,191,101, which are incorporated herein by reference. Also, disubstituted ferrocene derivatives can be prepared by the general procedure described in *J. Amer. Chem. Soc.,* 1978, 100, 7264. Ferrocene derivatives can be oxidized to prepare the corresponding ferrocenium salts by the procedure described in *Inorg. Chem.,* 1971, 10, 1559.

The preferred salts of organometallic complex cations useful in the compositions of the invention are derived from Formula I where $L^1$ is chosen from the class of aromatic compounds, preferably based on benzene, and $L^2$ is chosen from the class of compounds containing a cyclopentadienyl anion group, M is Fe and X is selected from the group consisting of tetrafluoroborate, hexafluorophosphate, hexafluoroarsenate, hexafluoroantimonate, tris-(trifluoromethylsulfonyl) methide, hydroxypentafluoroantimonate or trifluoromethanesulfonate. The most preferred salts of the organometallic complex cations useful in the invention are included in Formula I where only $L^1$ is present, or where both $L^1$ and $L^2$ are present, M is Fe and X is selected from the group consisting of tetrafluoroborate, hexafluorophosphate, hexafluoroarsenate, hexafluoroantimonate, hydroxypentafluoroantimonate, trifluoromethanesulfonate, and tris-(trifluoromethylsulfonyl) methide. The organometallic complex cations can be used as mixtures and isomeric mixtures.

In the preferred compositions of the invention, salts of the organometallic complex cation include those disclosed in U.S. Patent No. 5,089,536, which is incorporated herein by reference.

Examples of the preferred salts of organometallic complex cations useful in preparing the compositions of the invention include bis-(eta$^6$-arene)iron complex cations, bis (eta$^5$-cyclopentadienyl)iron complex cations, and (eta-5-cyclopentadienyl)iron arene complex cations such as:

bis-(eta$^6$-cumene)iron(2+) hexafluoroantimonate, bis-(eta$^6$-durene)iron(2+) hexafluoroantimonate, bis-(eta$^6$-mesitylene)iron(2+) trifluoromethanesulfonate, bis-(eta$^6$-mesitylene)iron(2+) hexafluoroantimonate, bis-(eta$^6$-mesitylene)iron(2+) tris-(trifluoromethylsulfonyl)methide, bis-(eta$^6$-hexamethylbenzene)iron(2+) hexafluoroantinonate, bis-(eta$^6$-pentamethylbenzene)iron(2+) hexafluoroantimonate, bis-(eta$^6$-naphthalene)iron(2+) hexafluoroantimonate, bis-(eta$^6$-pyrene)iron(2+) hexafluoroantimonate, (eta$^6$-naphthalene)(eta$^5$-cyclopentadienyl)iron(1+) hexafluoroantimonate, (eta$^6$-pyrene)(eta$^5$-cyclopentadienyl)iron(1+) hexafluoroantimonate, bis-(eta$^5$-pentamethylcyclopentadienyl)iron(1+) hexafluoroantimonate, bis-(eta$^5$-methylcyclopentadienyl)iron(1+) hexafluoroantimonate, bis-(eta$^5$-trimethylsilylcyclopentadienyl)iron(1+) hexafluoroantimonate, bis-(eta$^5$-indenyl)iron(1+) hexafluoroantimonate, (eta$^5$-cyclopentadienyl)(eta$^5$-methylcyclopentadienyl) iron(1+) hexafluoroantimonate, bis-(eta$^5$-cyclopentadienyl)iron(1+) trifluoromethanesulfonate, bis-(eta$^5$-cyclopentadienyl)iron(1+) hexafluoroantimonate, bis-(eta$^5$-cyclopentadienyl)iron(1+) tris-(trifluoromethylsulfonyl)methide, (eta$^6$-xylenes(mixed isomers))(eta$^5$-cyclopentadienyl) iron(1+) hexafluoroantimonate, (eta$^6$-xylenes(mixed isomers))(eta$^5$-cyclopentadienyl) iron(1+) hexafluophosphate, (eta$^6$-xylenes(mixed isomers))(eta$^5$-cyclopentadienyl) iron(1+) tris-(trifluoromethylsulfonyl)methide, (eta$^6$-xylenes(mixed isomers))(eta$^5$-cyclopentadienyl) iron(1+) bis-(trifluoromethylsulfonyl)imide, (eta$^6$-m-xylene)(eta$^5$-cyclopentadienyl)iron(1+) tetrafluoroborate, (eta$^6$-o-xylene)(eta$^5$-cyclopentadienyl)iron(1+) hexafluoroantimonate, (eta$^6$-p-xylenes)(eta$^5$-cyclopentadienyl)iron(1+) trifluoromethanesulfonate, (eta$^6$-toluene)(eta$^5$-cyclopentadienyl)iron(1+) hexafluoroantimonate, (eta$^6$-cumene)(eta$^5$-cyclopentadienyl)iron(1+) hexafluoroantimonate, (eta$^6$-m-xylene)(eta$^5$-cyclopentadienyl)iron(1+) hexafluoroantimonate, (eta$^6$-hexamethylbenzene)(eta$^5$-cyclopentadienyl)iron (1+) hexafluoroantimonate, (eta⁶-mesitylene)(eta⁵-cyclopentadienyl-)iron(1+) hexafluoroantimonate, (eta⁶-cumene)(eta⁵-cyclopentadienyl)iron(1+) hexafluorophosphate, (eta⁶-cumene)(eta⁵-cyclopentadienyl)iron(1+) tris-(trifluoromethylsulfonyl)methide, and (eta⁶-mesitylene)(eta⁵-cyclopentadienyl)iron(1+) pentafluorohydroxyantimonate.

In the polymerizable compositions of the present invention, the initiator salts can be present in a catalytically effective amount to initiate polymerization, generally in the range of 0.01 to 20 weight percent (wt %), preferably 0.1 to 10 wt %, of the curable composition; i.e., the total compositions excluding any solvent that may be present.

Accelerators of the present invention may be selected from two classes of materials. The active portions of these materials (see Formulae III and IV) can be part of a polymer or included as part of any component in the compositions of the invention.

Class 1 is described by the Formula III

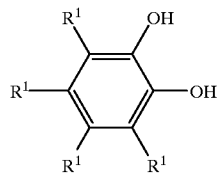

(III)

Molecules of Class 1 comprise dihydroxy aromatics wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted. When the molecule contains more than two aromatic hydroxy groups, at least two of the hydroxy groups must be adjacent to each other, i.e., in an ortho position. It is important that the substituting groups not interfere with the complexing action of the accelerating additive with the metal complex, or interfere with the cationic polymerization of the invention.

Examples of substituting groups that can be present in any $R^1$ group, all of which preferably have less than 30 carbon atoms and up to 10 hetero atoms wherein heteroatoms can interrupt carbon chains to form, for example, ether or thio linkages selected from sulfur or non-peroxidic oxygen, include hydrocarbyl groups such as methyl, ethyl, butyl, dodecyl, tetracosanyl, phenyl, benzyl, allyl, benzylidene, ethenyl, and ethynyl; cyclohydrocarbyl groups such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl, propoxycarbonyl, and phenoxycarbonyl; hydrocarbylcarbonyl such as formyl, acetyl, and benzoyl; hydrocarbylcarbonyloxy such as acetoxy, and cyclohexanecarbonyloxy; perfluorohydrocarbyl groups such as trifluoromethyl and pentafluorophenyl; azo; boryl; halo, for example, chloro, iodo, bromo, and fluoro; hydroxy; cyano; nitro; nitroso; trimethylsiloxy; and aromatic groups such as cyclopentadienyl, phenyl, naphthyl and indenyl. Additionally, the $R^1$s may be a unit of a polymer. Examples of this type would be catechol novolak resins, or polystyrene type polymers where the phenyl ring is substituted with at least ortho-dihydroxy groups.

Examples of suitable Class I accelerators are catechol; pyrogallol; gallic acid; esters of gallic acid (prepared from the condensation of the carboxylic acid of gallic acid with alcohols), such as, methyl gallate, ethyl gallate, propyl gallate, butyl gallate; tannins such as tannic acid; alkylcatechols such as 4-tert-butylcatechol, nitrocatechols such as 4-nitrocatechol, methoxycatechol such as 3-methoxycatechol; 2,3,4-trihydroxybenzophenone; and 2,3,4-trihydroxyacetophenone.

Class 1 accelerators can be present in an amount in the range of 0.01 to 10.0 weight percent, preferably 0.1 to 4 weight percent of the total polymerizable composition.

Class 2 is described by the Formula IV

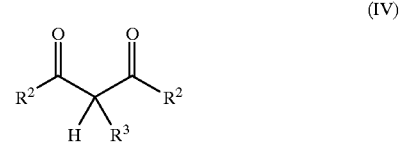

(IV)

Molecules of Class 2 comprise those compounds having a β-diketone moiety wherein each $R^2$ can be the same or different and, excluding hydrogen, can be the same as $R^1$ described for the Class 1 accelerators, and wherein $R^3$ can be a substituted or unsubstituted alkyl or aryl group. Examples of suitable accelerators of this class are 2,4-pentanedione, 3,5-heptanedione, 1,3-diphenyl-1,3-propanedione, 1-phenyl-1,3-butanedione, 1,1,1-trifluoro-2,4-pentanedione, 1,1,1,5,5,5-hexafluoro-2,4-pentanedione, and 1-(4-methoxyphenyl)-3-(4-tert-butylphenyl)propane-1,3-dione available as PARSOL 1789 from Roche Vitamins, Inc., Parsippany, N.J., and as EUSOLEX 9020 from EM Industries, Inc., Hawthorne, N.Y. The preferred compound from Class 2 is 2,4-pentanedione. Class 2 accelerating additives are particularly useful with the bis-eta⁶-arene type organometallic salts. Class 2 accelerators can be present in an amount in the range of 0.05 to 10.0 weight percent, preferably 0.05 to 4 weight percent of the total polymerizable composition.

It should be noted that accelerators of different classes, or even within a class, may not be equally effective with any given initiator.

It can also be preferred and within the scope of this invention to add mono- or poly-alcohols as tougheners to the polymerizable composition. The alcohol or polyol aids in chain extension and preventing over-crosslinking of the epoxide during curing.

Representative mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxyethanol, cyclopentanol, cyclohexanol, cyclohexylnethanol, 3-cyclohexyl-1-propanol, 2-norboanemethanol, and tetrahydrofuryl alcohol.

The polyols useful in the present invention have two to five, preferably two to four, non-phenolic hydroxyl groups. Examples of useful polyols include, but are not limited to, 1,2-ethanediol, 1,2-propanediol, 1,3-propanediol, 1,4-butanediol, 1,3-butanediol, 2-methyl-1,3-propanediol, 2,2-dimethyl-1,3-propanediol, and 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, diethylene glycol, triethylene glycol, tetraethylene glycol, glycerine, 2-ethyl-2-(hydroxymethyl)-1,3-propanediol, 2-ethyl-2-methyl-1,3-propanediol, pentaerythritol, 2-ethyl-1,3-pentanediol, and 2,2-oxydiethanol, sorbitol, 1,4-cyclohexane dimethanol, 1,4-benzene dimethanol, 2-butene-1,4-diol, and polyalkoxylated bis-phenol A derivatives. Other examples of useful polyols are disclosed in U.S. Pat. No. 4,503,211, which is incorporated herein by reference.

Higher molecular weight polyols include the polyethylene and polypropylene oxide polymers in the molecular weight range of 200 to 20,000 such as the CARBOWAX polyethyleneoxide materials supplied by Union Carbide, caprolactone polyols in the molecular weight range of 200 to 5,000, such as the TONE polyol materials supplied by Union Carbide, polytetramethylene ether glycol in the molecular weight range of 200 to 4,000, such as the TERATHANE materials supplied by Dupont (Wilmington, Del.), hydroxyl terminated polybutadiene resins such as the POLY BD supplied by Elf Atochem, hydroxyl terminated polyester materials such as the DYNAPOL copolyester materials from Creanova Inc., Somerset, N.J.,or equivalent materials supplied by other manufacturers.

The alcohol functional component can be present as a mixture of materials and can contain mono- and poly-hydroxyl containing materials. The alcohol is preferably present in an amount sufficient to provide an epoxy to hydroxy ratio in the composition between about 1:0.1 and 1:1, more preferably between about 1:0.2 and 1:0.8, and most preferably between about 1:0.2 and 1:0.6.

It is also within the scope of this invention to incorporate thermoplastic oligomeric or polymeric resins to aid in the production of film-based compositions. These thermoplastics can make it easier to form films, i.e., are used as film-formers, and in some cases permit rework of a bond using an appropriate solvent. The thermoplastic resins include those that preferably have glass transition temperatures and/or melting points less than 120° C. Useful thermoplastic resins are essentially free of groups that would interfere with the cationic polymerization of the cationically curable monomers. More particularly, useful thermoplastic resins are essentially free of nucleophilic groups, such as amine, amide, nitrile, sulfur or phosphorus functional groups. Furthermore, suitable thermoplastic resins are soluble in solvents such as tetrohydrofuran (THF) or methylethylketone (MEK) and exhibit compatibility with the epoxy resin used.

This compatibility allows the blend of epoxy resin and thermoplastic resin to be solvent cast without phase separating. Nonlimiting examples of thermoplastic resins having these characteristics and useful in this invention include polyesters, co-polyesters, acrylic and methacrylic resins, polysulfones, phenoxy resins such as the PAPHEN materials available from Phenoxy Associates, Rock Hill, S.C., and novolac resins. It is also within the scope of this invention to use a blend of more than one thermoplastic oligomeric or polymeric resin in preparing compositions.

When it is desired to increase the pot-life of compositions of this invention, it can be useful to include a stabilizing additive. Useful pot-life stabilizing additives include Lewis basic, nitrogen-chelate ligands such as 1,10-phenanthroline, 2,2'-dipyridyl, and 2,4,6-tripyridytriazine; trialkyl, triaryl, tricycloalkyl, and trialkaryl amines, phosphines, phosphine oxides, phosphites, arsines, and stibines including triphenylphosphine, triphenylstibine, triphenylarsine, and triphenylphosphite; macrocyclic kryptands and crown ethers such as 12-CROWN-4, 15-CROWN-5, 18-CROWN-6, 21-CROWN-7, KRYPTOFIX 211, and KRYPTOFIX 222, all available from Aldrich Chemical Company, Milwaukee, Wis.; and Schiff base derivatives, which are generally made by the condensation of a ketone or aldehyde with a primary amine. Suitable stabilizing additives are described in U.S. Pat. No. 5,494,943 which is incorporated herein by reference.

A suitable initiation system that includes organometallic complex ionic salts described by Formula I, and at least one accelerator taken from Classes 1 or 2 contains those combinations that, upon application of sufficient energy, generally in the form of heat and/or light, will catalyze the polymerization of the compositions of the invention. The level of catalytic activity depends on various factors such as the choice of ligands and counterions in the organometallic salt and the selection of the type and amount of the at least one accelerator.

Temperature of polymerization and amount of initiator system used will vary depending on the particular polymerizable composition used and the desired application of the polymerized product.

Addition of a silane coupling agent is optional in the preparation of cured compositions of the invention. Preferably the silane coupling agent is added to the polymerizable composition to improve adhesion when at least one substrate surface is glass, an oxide, or any other surface that would benefit from the addition of a silane coupling agent. When present, a silane coupling agent contains a functional group that can react with an epoxy resin, e.g., 3-glycidoxypropyltrimethoxylsilane.

Solvents, preferably organic, can be used to assist in dissolution of the initiator system in the polymerizable monomers, and as a processing aid. It may be advantageous to prepare a concentrated solution of the organometallic complex salt in a small amount of solvent to simplify the preparation of the polymerizable composition. Useful solvents are lactones, such as gamma-butyrolactone, gamma-valerolactone; and epsilon-caprolactone; ketones such as acetone, methyl ethyl ketone, methyl isobutyl ketone, cyclopentanone and cyclohexanone; sulfones, such as tetramethylene sulfone, 3-methylsulfolane, 2,4-dimethylsulfolane, butadiene sulfone, methyl sulfone, ethyl sulfone, propyl sulfone, butyl sulfone, methyl vinyl sulfone, 2-(methylsulfonyl)ethanol, 2,2'-sulfonyldiethanol; sulfoxides, such as dimethyl sulfoxide; cyclic carbonates such as propylene carbonate, ethylene carbonate and vinylene carbonate; carboxylic acid esters such as ethyl acetate, methyl cellosolve acetate, methyl formate; and other solvents such as methylene chloride, nitromethane, acetonitrile, glycol sulfite and 1,2-dimethoxyethane (glyme). In some applications, it may be advantageous to adsorb the initiator onto an inert support such as silica, alumina, clays, as described in U.S. Pat. No. 4,677,137, which is incorporated herein by reference.

Suitable sources of heat to cure the compositions of the invention include induction heating coils, ovens, hot plates, heat guns, infrared sources including lasers, microwave sources. Suitable sources of electromagnetic radiation include ultraviolet light sources, visible light sources, and e-beam sources.

Suitable substrates useful to provide articles of the invention include, for example, metals (for example, aluminum, copper, cadmium, zinc, nickel, steel, iron, silver), glass, paper, wood, various thermoplastic films (for example, polyethylene terephthalate, plasticized polyvinyl chloride, polypropylene, polyethylene), thermoset films (for example, polyimide), cloth, ceramics and cellulosics, such as cellulose acetate.

Adjuvants may optionally be added to the compositions such as colorants, abrasive granules, anti-oxidant stabilizers, thermal degradation stabilizers, light stabilizers, conductive particles, tackifiers, flow agents, bodying agents, flatting agents, inert fillers, binders, blowing agents, fungicides, bactericides, surfactants, plasticizers, rubber tougheners and other additives known to those skilled in the art. They also can be substantially unreactive, such as fillers, both inorganic and organic. These adjuvants, if present are added in an amount effective for their intended purpose.

Compositions of this invention are useful to provide abrasion-resistant or protective coatings to articles, and are useful as molded articles and as adhesives, including hot melt and structural adhesives, and as binders for abrasives. Compositions of this invention may also exhibit a color change upon activation of a catalyst in the composition or curing of the composition. Additional examples of compositions that can exhibit such a color change are disclosed in copending U.S. patent application Ser. No. 09/224,421 (Attorney Docket No. 54529USA1A), which is incorporated herein by reference.

In general, a composition's physical properties, i.e., hardness, stiffness, modulus, elongation, strength, etc., is determined by the choice of the epoxy resin, and if an alcohol containing material is used, the ratio of epoxy to alcohol and the nature of the alcohol. Depending on the particular use, each one of these physical properties of the system will have a particular optimum value. Generally, the cured material from a higher epoxy/alcohol ratio is stiffer than from a lower epoxy/alcohol ratio. Generally, for an epoxy/alcohol composition, a shorter chain polyol yields a cured composition that is stiffer than when using a longer chain polyol. The stiffness of a composition can also be increased by using a shorter chain monofunctional alcohol to replace a polyol. Epoxy/alcohol mixtures generally cure faster than epoxy-only compositions. Cycloaliphatic epoxies cure more rapidly than glycidyl ether epoxies. Mixtures of these two types of epoxies can be used adjust the cure rate to a desired level.

To prepare a coated abrasive article using the materials of the subject invention, abrasive particles must be added to the curable composition. The general procedure is to select a suitable substrate such as paper, cloth, polyester, etc., coat this substrate with the "make coat," which consists of the curable composition, applying the abrasive particles, and then curing by the application of a source of energy. A "size coat", which cures to a harder material than the make coat, is then coated over the make coat and cured. The size coat serves to lock the abrasive particles in place. For this and other applications the coating preferably is provided by methods such as bar, knife, reverse roll, extrusion die, knurled roll, or spin coatings, or by spraying, brushing, or laminating.

To prepare a structural/semi-structural adhesive, the curable composition could contain additional adjuvants such as silica fillers, glass bubbles and tougheners. These adjuvants add toughness to, and reduce the density of, the cured composition. Generally shorter chain polyols would be used to give toughness through chain extension of the cured epoxy. A chain diol that is too long generally would produce too soft a cured composition that would not have the strength needed for structural/semi-structural applications. Using polyols having high hydroxyl functionality greater than three could produce an overcrosslinked material resulting in a brittle adhesive.

To prepare magnetic media using the materials of the subject invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare a clear abrasion resistant coating from the materials of the subject invention, two important criteria for selecting the composition are clarity and toughness of the cured composition. Generally, particulate adjuvants would not be added since they would reduce the gloss and clarity of the cured composition. Optionally, pigments or dyes could be added to produce a colored film.

To prepare an electrically conductive adhesive, the curable composition is filled with conductive particles to the level that provides conduction through the adhesive between the desired contact points. One class of conductive adhesives is often referred to as "z-axis adhesives" or as "anisotropically conductive adhesives." This class of adhesive is filled with conductive particles to the level that provides conduction between contact points in the z-axis but not the x-y plane of the adhesive. Such z-axis adhesives are often produced as a thin film adhesive on a carrier substrate, such as a polymer film. A description of materials suitable for z-axis adhesives is disclosed in U.S. Pat. No. 5,362,421, which is incorporated herein by reference.

Molded articles are made by means known to those skilled in the art, as, for example, by reaction injection molding, casting, etc.

Objects and advantages of this invention are further illustrated by the following examples, but they should not be construed as limiting the invention.

EXAMPLES

In the examples, all parts, ratios, and percents are by weight unless specifically indicated otherwise. All materials used are commercially available from Aldrich Chemical Co., Milwaukee, Wis. unless otherwise indicated. All examples were prepared in ambient atmosphere (in the presence of usual amounts of oxygen and water vapor) unless indicated otherwise.

The general sample preparation procedure was as follows: the desired amount of accelerating additive was mixed with the epoxy-containing composition; the resulting mixture was warmed, if necessary, to insure complete dissolution of the components; the mixture was allowed to cool to room temperature (23° C.) before use. Curable mixtures were prepared by measuring out the desired amount of the cationic organometallic catalyst, adding the desired amount of solvent to dissolve the catalyst, then adding the appropriate amount of the epoxy- and accelerator- containing mixture followed by thorough mixing by hand using a wood applicator stick.

Differential Scanning Calorimetry (DSC)

Differential Scanning Calorimetry (DSC) was performed on a TA Instruments Inc. (New Castle, Del.) 912 DSC, and used to measure the exothermic heat of reaction associated with the thermal cure of the cationically polymerizable monomer. DSC samples were typically 6 to12 mg. Testing was done in sealed, aluminum, liquid sample pans, at a rate of 10° C./min from room temperature (23° C.) to 300° C. The data from the reaction process was graphed on a chart showing heat flow vs. temperature. The integrated area under an exothermic peak represents the total exotherm energy produced during the reaction and is measured in Joules/gram (J/g); the exotherm energy is proportional to extent of cure, i.e., degree of polymerization. The exotherm profile, i.e., onset temperature (the temperature at which reaction will begin to occur), peak temperature, and end temperature, provides information on conditions needed to cure the material. For any particular reaction, a shift toward lower onset and/or peak temperature for the exotherm indicates that the reactant material is polymerizing at the lower temperatures, which correlates with shorter gel times.

Differential Photo-Calorimetry (DPC)

Differential Photo-Calorimetry was used to measure the exothermic heat of reaction associated with the photoinitiated cure of a cationically polymerizable monomer during exposure to light. DPC samples sizes were typically 6 to12 mg. Testing was done in open aluminum pans, under nitrogen purge, in a TA Instruments Inc. 912 DSC base, equipped with a TA Instruments Inc. 930 differential photocalorimeter (TA Instruments Inc. New Castle, Del.). A 200 watt mercury lamp was used for the photolysis step. In a typical experiment, the sample is held isothermally at the desired temperature throughout the entire DPC experiment. The sample is kept dark for 2 minutes, then a shutter is opened to allow the sample to be irradiated for 5 minutes after which the shutter is closed and the sample is kept dark for an additional 2 minutes. The data from the DPC experiment was graphed on a chart showing the exothermic heat flow vs. time. The area under the exothermic peak represents the total exotherm energy produced during the irradiation, and is measured in Joules/gram (J/g). The exotherm energy is proportional to the extent of cure, and for any particular reaction an increase in the total DPC exotherm energy would indicate a higher degree of cure during the irradiation. Immediately following the DPC experiment, the samples were capped and heated at 10° C./minute in a DSC experiment as described above. The Total Exotherm Energy is the combination of DPC and DSC Energies and is the total exotherm energy of polymerization. GLOSSARY

| Identification Of Components Used In The Examples | |
|---|---|
| ERL 4221 | 3,4-epoxycyclohexylmethyl-3,4-epoxy cyclohexanecarboxylate (ERL 4221 available from Union Carbide Corp., Danbury, CT) |
| EPON 828 | Diglycidyl ether of bisphenol A (EPON 828 available from Shell Chemical Co., Houston, TX) |
| CHDM | 1,4-cyclohexanedimethanol |
| THBP | 2,3,4-trihydroxybenzophenone |
| THAP | 2,3,4-trihydroxyacetophenone |

| Initiators | |
|---|---|
| (mesitylene)$_2$Fe(SbF$_6$)$_2$ | bis-(eta$^6$-mesitylene)iron( + 1) bis-hexafluoroantimonate |
| CpFeXylShF$_6$ | (eta$^6$-xylenes)(eta$^5$-cyclopentadienyl)iron( + 1) hexafluoroantimonate |
| Cp | Cyclopentadienyl |
| Xyl | Xylenes (mixed isomers) |

Comparative Example C1

To determine the gel time for an epoxy-containing composition that did not contain an accelerating additive, 0.02 g of (mesitylene)$_2$Fe(SbF$_6$)$_2$ was weighed into an aluminum weighing dish (VWR/Scientific Products Inc., West Chester, Pa.), followed by the addition of 0.04 g of propylene carbonate solvent. To aid the dissolution of the initiator in the solvent, the mixture was stirred using a wood applicator stick (Puritan brand, available from Hardwood Products Company, Guilford, Me.). To the resulting catalyst solution was added 2.0 g of an EPON 828/1,6-hexanediol/CHDM mixture(88:6:6 weight % ratio based on the total weight of the mixture (w/w)), hereafter referred to as "monomer mixture." The monomer mixture was prepared by first heating a 50:50 weight ratio mixture of 1,6-hexanediol and CHDM at 60° C., allowing the resulting liquid to cool to room temperature, then adding 12 weight % of this liquid to an appropriate amount of EPON 828. The resulting mixture was heated for 30 minutes at 80° C. then shaken vigorously for 30 seconds to obtain a homogeneous solution that turned milky white upon cooling to room temperature over a 30 minute period. Addition of the monomer mixture to the catalyst solution was followed by thorough mixing by hand using a wood applicator stick. To measure the gel time the pan was then placed on a hot plate, which was preheated to 125° C. The samples were tested for cure periodically by scraping the sample with the end of a wooden applicator stick. The presence of a gel was indicated by solidification of the liquid resin. Gel time or cure time was deemed to be the time at which the sample was no longer liquid. In this example, gel was formed after 1:27 (min:sec).

Examples 1–7

The effect of adding 1 weight % of a Class 1 accelerating additive to a thermally curable composition was examined. Stock solutions of accelerating additives ("additives") and epoxy resin were prepared by combining, in a glass jar, 0.1 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), which had been pre-heated to 80° C., for approximately 30 minutes to insure complete dissolution of the components; after heating the jar was shaken vigorously for 15 seconds and then the mixture was allowed to cool to room temperature (23° C.) before use. This produced a 1% w/w solution of the additive in the epoxy containing composition.

For each example, 0.02 g of (mesitylene)$_2$Fe(SbF$_6$)$_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example 1. The data of Table 1 show that, under the conditions used, the incorporation of a Class 1 type accelerating additive decreased the gel time of the formulation, when compared to the gel time obtained in Comparative Example 1. For each example, it should be noted that the color of the formulations changed from pale orange to dark violet during the thermal cure.

TABLE 1

Gel Time Experiments with 1% Accelerating Additive

| Ex. | Additive | Gel Time (min:sec) |
| --- | --- | --- |
| 1 | THBP | 0:35 |
| 2 | THAP | 0:40 |
| 3 | Pyrogallol | 1:06 |
| 4 | Propyl gallate | 1:10 |
| 5 | Tannic acid | 1:14 |
| 6 | 4-Nitrocatechol | 1:16 |
| 7 | Catechol | 1:25 |

Examples 8–14

The effect of adding 2 weight % of a Class 1 accelerating additive to a thermally curable compositions was examined. Stock solutions of accelerating additives and epoxy resin were prepared by combining, in a glass jar, 0.2 g of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components; after heating the jar was shaken vigorously and then the mixture was allowed to cool to room temperature (23° C.) before use. This produced a 2% w/w solution of the additive in the epoxy.

For each example, 0.02 g of $(mesitylene)_2Fe(SbF_6)_2$ was weighed into an aluminum dish, followed by the addition of 0.04 g of propylene carbonate solvent. To aid the dissolution of initiator in the solvent, the mixture was stirred using a wood applicator stick. To the resulting catalyst solution was added 2.0 g of the appropriate stock solution followed by thorough mixing, by hand, using a wood applicator stick.

Gel times were determined at 125° C. following the procedure described in Comparative Example 1. The data of Table 2 show that, under the conditions used, the incorporation of a Class 1 type accelerating additive decreased the gel time of the formulation, when compared the gel time obtained in Comparative Example 1. Additionally, when compared to Examples 1–7, the data in Table 2 show that incorporation of 2% accelerating additive provided faster gel times than formulations containing 1% accelerating additive. As was seen in Examples 1–7, the color of the formulations changed from orange to dark violet during the thermal cure.

TABLE 2

Gel Time Experiments with 2% Accelerating Additive

| Ex. | Additive | Gel Time (min:sec) |
| --- | --- | --- |
| 8 | THBP | 0:31 |
| 9 | THAP | 0:34 |
| 10 | 4-Nitrocatechol | 0:59 |
| 11 | Pyrogallol | 1:01 |
| 12 | Propyl gallate | 1:05 |
| 13 | Tannic acid | 1:05 |
| 14 | Catechol | 1:17 |

Comparative Examples C2–C5

Meta- and para- dihydroxy-substituted benzene compounds were evaluated as accelerating additives. Stock solutions of the additives were prepared following the procedure generally described for Examples 2–14.

For each comparative example, 0.02 g of $(mesitylene)_2Fe(SbF_6)_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined at 125° C. following the procedure described in Comparative Example 1, with the results listed in Table 3. When compared to the data from Comparative Example 1 and Examples 1–14, the data from Table 3 show that these additives, having only meta- or para-dihydroxy groups, in contrast to the ortho-dihydroxy groups of the accelerators of the present invention, were not effective as accelerating additives.

TABLE 3

| Comp Ex. | Additive | Gel Time (min:sec) |
| --- | --- | --- |
| C2 | 1% resorcinol | 1:51 |
| C3 | 2% resorcinol | 2:02 |
| C4 | 1% hydroquinone | 2:17 |
| C5 | 2% hydroquinone | 2:28 |

Examples 15–22 and Comparative Example C6

The effect of adding a Class 2 accelerating additive to a thermally curable composition was examined. Stock solutions of accelerator/epoxy mixtures were prepared having 0.125%, 0.25%, 0.5%, 1%, 2%, 4%, 8%, and 12% 2,4-pentanedione by adding 0.0125 g, 0.025 g, 0.05 g, 0.1 g, 0.2 g, 0.4 g, 0.8 g, and 1.2 g, respectively, of 2,4-pentanedione, to separate vials containing 10 g of an EPON 828/1,6-hexanediol/CHDM (88:6:6 w/w) mixture (prepared in the same manner as described in Comparative Example C1), and mixing thoroughly, by hand, using a wood applicator. For each example, 0.02 g of $(mesitylene)_2Fe(SbF_6)_2$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Two samples for each example were prepared, with gel times be determined at 125° C. and 80° C. The results in Table 4 show that small amounts of the accelerating additive significantly decreased the gel time, and that increasing the amount of additive generally correlated with faster gel times. It was found that with concentrations of accelerating additives greater than 4%, the cured materials, although completely solid, were significantly softer than control materials or materials made with lower concentrations of the additives, as determined by observing and handling the samples. It was also observed that for each example the color of the formulations changed from pale orange to dark red during the thermal cure.

TABLE 4

Effect of Accelerating Additive Concentration on Gel Time

| Ex. | % Pentanedione | Gel Time 125° C. (min:sec) | Gel Time 80° C. (min:sec) |
|---|---|---|---|
| Comp. Ex. C1 | 0 | 1:27 | — |
| Comp. Ex. C6 | 0 | — | >10:00 |
| 15 | 0.125 | 0:42 | 2:47 |
| 16 | 0.25 | 0:27 | 1:51 |
| 17 | 0.5 | 0:31 | 1:28 |
| 18 | 1 | 0:33 | 1:25 |
| 19 | 2 | 0:33 | 1:05 |
| 20 | 4 | 0:17 | 0:55 |
| 21 | 8 | 0:35 | 0:45 |
| 22 | 12 | 0:46 | 0:46 |

Examples 23–24 and Comparative Examples C7–C8

The effect of adding a Class 1 accelerating additive to a photo-curable composition was examined using differential photo-calorimetry (DPC). For both the comparative examples and the examples, the photoinitiated polymerization of an epoxy composition, with and without an accelerating additive, was investigated using differential photocalorimetry (DPC), at 40° C., followed by differential scanning calorimetry (DSC). For the Comparative Examples, 0.02 g of the selected photoinitiator was weighed into an aluminum dish, followed by the addition of 0.04 g of 3-methylsulfolane solvent. To aid the dissolution of the initiator in the solvent, the mixture was stirred using a wood applicator stick. To the resulting catalyst solution was added 2.0 g of ERL 4221 followed by thorough mixing, by hand, using a wood applicator stick. The resulting solution was subjected to light then heat in accordance with the DPC and DSC test methods described herein. The results are shown in Table 5. After completing the DPC and the DSC tests for the comparative examples, the samples for Examples 23–24 were prepared by adding 0.08 g of 3-methoxycatechol to each formulation of the comparative examples and mixing thoroughly at room temperature until the 3-methoxycatechol was completely dissolved. The resulting composition was examined using DPC and DSC, with the results shown in Table 5. The data in Table 5 show that the addition of the accelerating additive increases the degree of polymerization during exposure to light, as evidenced by an increase in DPC exotherm energy upon addition of the accelerators.

TABLE 5

DPC and DSC Measurements of Photopolymerization

| Ex. | Photoinitiator | Accelerating Additive | DPC Energy (J/g) | DSC Energy (J/g) | Total Exotherm (J/g) |
|---|---|---|---|---|---|
| C7 | $(Mes)_2Fe(SbF_6)_2$ | None | 126 | 366 | 492 |
| 23 | $(Mes)_2Fe(SbF_6)_2$ | 4% methoxycatechol | 363.6 | 21 | 384 |
| C8 | $CpFeXylSbF_6$ | None | 0 | 404 | 404 |
| 24 | $CpFeXylSbF_6$ | 4% methoxycatechol | 79 | 363 | 442 |

Comparative Example C9

To determine the gel time for a photoinitiated epoxy composition that does not contain an accelerating additive, 0.02 g of $CpFeXylSbF_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick. The resulting sample was then placed under a 500 Watt tungsten-halogen lamp, with the sample positioned 12 cm (4.72 inches) away from the light source, and irradiated continuously until gellation was observed. The presence of a gel was indicated by solidification of the liquid resin. In this Comparative Example, gel was formed after 3:35 (min:sec).

Examples 25–31

The gel time for a photoinitiated epoxy composition containing a Class 1 accelerating additive was examined. Stock solutions of different Class 1 accelerator additives and epoxy resin were prepared by combining, in a glass jar, 0.1 g of the additive with 10 g of EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven (Despatch Industries, Inc. Minneapolis, Minn.), pre-heated to 80° C., for approximately 30 minutes to insure complete dissolution of the components; after heating the jar was shaken vigorously for 15 seconds and then the mixture was allowed to cool to room temperature (23° C.) before use. The produced a 1% w/w solution of the additive in the epoxy.

For each example, 0.02 g of $CpFeXylSbF_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the appropriate stock solution followed by thorough mixing, by hand, using a wood applicator stick. Gel times were determined following the procedure described in Comparative Example 9, with the results shown in Table 6. The data of Table 6 show that the incorporation of Class 1 type accelerating additives into an epoxy-containing formulation decreases the gel time.

TABLE 6

Gel Time Experiments with 1% Accelerating Additive

| Ex. | Additive | Gel Time (min:sec) |
|---|---|---|
| 25 | Tannic acid | 1:08 |
| 26 | THBP | 1:13 |
| 27 | THAP | 1:20 |
| 28 | Propyl gallate | 1:18 |
| 29 | 4-Nitrocatechol | 1:29 |
| 30 | Pyrogallol | 3:08 |
| 31 | Catechol | 3:25 |

Examples 32–33 and Comparative Example C10

The effect of adding various levels of a Class 1 accelerating additive to a photoinitiated composition was examined. For these examples, the photoinitiated polymerization of an epoxy composition, with and without an accelerating additive, was investigated using differential photocalorimetry (DPC) followed by differential scanning calorimetry (DSC). Stock solutions having 1% and 2% propyl gallate in epoxy resin were prepared by combining, in a glass jar, 0.1 and 0.2 g, respectively, of the additive with 10 g of an EPON 828/1,6-hexanediol/1,4-CHDM (88:6:6 w/w) mixture (prepared in the same manner as described in Comparative Example C1). The glass jar containing the epoxy/accelerator mixture was capped and placed into a Despatch LFD 1-42-3 oven, pre-heated to 80° C., for approximately 30 minutes to insure maximum dissolution of the accelerator; after heating, the jar was shaken vigorously for 15 seconds and the mixture was allowed to cool to room temperature (23° C.) before use. This produced a 1% w/w and 2% w/w solution, respectively, of the additive in the epoxy.

For each example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the desired stock solution, followed by thorough mixing, by hand, using a wood applicator stick. For the comparative example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of an EPON 828/1,6-hexanediol/CHDM (88:6:6 w/w) mixture (prepared in the same manner as described in Comparative Example C1), followed by thorough mixing, by hand, using a wood applicator stick.

The resulting solutions for the examples and the comparative example were subjected to light then heat in accordance with the DPC and DSC test methods described herein, with the results shown in Table 7. The DPC tests were run at 40° C. No exotherm was observed for either the examples or the comparative examples in the DPC; however, the effect of the accelerating additive can be seen from the subsequent DSC tests. The data in Table 7 show that the exotherm peak temperature shifts to lower temperatures upon addition of 1% propyl gallate, and shifted to even lower temperatures when 2% propyl gallate was incorporated into the epoxy formulation. The data are graphically illustrated in FIG. 1. The DSC exotherm energy was determined by integrating the energy under the curve between 43° C. and 200° C. The amount of integrated exotherm energy both above and below the Comparative Example C10 peak maximum temperature (115.3° C.) was then calculated. The larger the area of total DSC exotherm energy below the comparative example peak temperature, the higher the degree of cure. It can be seen from Table 7 that upon addition of increasing amounts of accelerating additive, significantly higher degree of cure was obtained when larger amounts of additive were present.

TABLE 7

DSC Experiments with Various Amounts of Propyl Gallate

| Ex. | % Propyl Gallate | Exotherm Peak Temp. (° C.) | Total DSC Exotherm Energy (J/g) | DSC Energy below 115° C. (J/g) |
|---|---|---|---|---|
| Comp. Ex. C10 | 0 | 115 | 424 | 208 |
| 32 | 1% | 113 | 417 | 301 |
| 33 | 2% | 99 | 376 | 306 |

Example 34

The gel time for a photoinitiated epoxy composition containing a Class 2 accelerating additive was examined. A 1% stock solution of a Class 2 accelerator additive, 2,4-pentanedione, was prepared by combining 0.1 g of 2,4-pentanedione with 10 g of an EPON828/1,6hexanediol/CHDM (88:6:6 w/w) mixture and stirring thoroughly, by hand, using a wood applicator stick. This produced a 1% w/w solution of the additive in the epoxy. For this example, 0.02 g of CpFeXylSbF$_6$ was weighed into an aluminum dish, followed by the addition of 0.04 g of propylene carbonate solvent. To aid the dissolution of the initiator in the solvent, the mixture was stirred using a wood applicator stick. To the resulting catalyst solution was added 2.0 g of the accelerator/epoxy solution, followed by thorough mixing, by hand, using a wood applicator stick. Gel times were determined following the procedure described in Comparative Example 9. For this example a gel time of 5:46 (min:sec) was obtained. When the gel time of this example is compared to the result from Comparative Example 9, it can be seen that a 1% solution of this Class 2 type accelerating additive was not particularly useful for accelerating the gel times of formulations cured using the CpFeXylSbF$_6$ catalyst.

Various modifications and alterations of this invention will become apparent to those skilled in the art without departing from the scope and spirit of this invention, and it should be understood that this invention is not to be unduly limited to the illustrative embodiments set forth herein.

We claim:

1. A method comprising the step of adding an accelerator to increase the rate, or reduce the temperature, of cure of an energy-polymerizable composition wherein the composition comprises a cationically curable material and at least one salt of an organometallic complex cation, wherein said cation contains at least one carbon atom bonded to a transition metal atom, and wherein said accelerator, or an active portion thereof, comprises at least one compound selected from classes 1 and 2 wherein
class 1 comprises compounds represented by the following formula

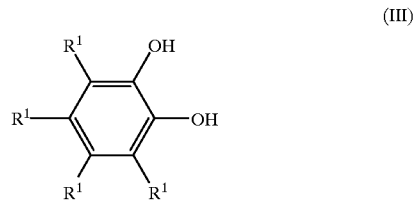

(III)

wherein molecules of Class 1 comprise dihydroxy aromatics wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted and wherein when the molecule contains more than two aromatic hydroxy groups, at least two of the hydroxy groups are adjacent to each other and class 2 comprises compounds represented by the following formula

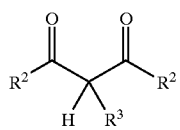

(IV)

wherein molecules of Class 2 comprise those compounds having a β-diketone moiety wherein each $R^2$ can be the same or different and, excluding hydrogen, can be the same as $R^1$ described for the Class 1 accelerators, and wherein $R^3$ can be a substituted or unsubstituted alkyl or aryl group.

2. The method of claim 1 further comprising adding sufficient energy in the form of at least one of heat and light, in any combination or order, to cure said cationically curable material.

3. An energy polymerizable composition comprising
a) at least one cationically curable material,
b) a two-component initiator system comprising
   (1) at least one salt of an organometallic complex cation, wherein said cation contains at least one carbon atom bonded to a transition metal atom, and
   (2) at least one accelerator, or an active portion thereof, from classes 1 and 2:
wherein
   class 1 comprises compounds represented by the following formula

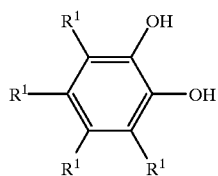

(III)

wherein molecules of Class 1 comprise dihydroxy aromatics wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted and wherein when the molecule contains more than two aromatic hydroxy groups, at least two of the hydroxy groups must be adjacent to each other, and class 2 comprises compounds represented by the following formula

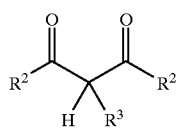

(IV)

wherein molecules of Class 2 comprise those compounds having a β-diketone moiety wherein each $R^2$ can be the same or different and, excluding hydrogen can be the same as $R^1$ described for the Class 1 accelerators, and wherein $R^3$ can be a substituted or unsubstituted alkyl or aryl group.

4. The composition according to claim 3 further comprising at least one mono or poly alcohol.

5. The composition according to claim 3 further comprising at least one pot-life stabilizing additive.

6. The composition according to claim 3 wherein said salt of an organometallic complex cation has the formula $$[(L^1)_y(L_2)_z M]^{+q} X_n$$ (I)

wherein
   M is selected from the group containing Cr, Ni, Mo, W, Mn, Tc, Re, Fe, Ru, Os, Co, Rh and Ir;
   $L^1$ represents none, one or two of the same or different ligands contributing pi-electrons that can be selected from aromatic compounds and heterocyclic aromatic compounds, and the ligand is capable of contributing six pi-electrons to the valence shell of M;
   $L^2$ represents none, one or two of the same or different ligands contributing pi-electrons that can be selected from cyclopentadienyl and indenyl anion groups, and the ligand is capable of contributing six pi-electrons to the valence shell of M;
   q is an integer having a value of 1 or 2, the residual charge of the complex cation;
   y and z are integers having a value of zero, one, or two, provided that the sum of y and z is equal to 2;
   X is an anion selected from tris-(highly fluorinated alkyl)sulfonyl methide, bis-(highly fluorinated alkyl) sulfonyl imide, tris-(fluorinated aryl)sulfonyl methide, tetrakis-(fluorinated aryl) borate; organic sulfonate anions, and halogen-containing complex anions of a metal or metalloid; and
   n is an integer having a value of 1 or 2, the number of complex anions required to neutralize the charge q on the complex cation.

7. The composition according to claim 6 wherein said salt is selected from the group consisting of bis-(eta$^6$-arene)iron complex cations, bis(eta$^5$-cyclopentadienyl)iron complex cations, and (eta-5-cyclopentadienyl)iron arene complex cations.

8. The composition according to claim 3 wherein said accelerator is a class 1 compound.

9. The composition according to claim 8 wherein said class 1 accelerator is propyl gallate.

10. The composition according to claim 8 wherein said class 1 accelerator is 2,3,4-trihydroxybenzophenone.

11. The composition according to claim 3 wherein said accelerator is a class 2 compound.

12. The composition according to claim 11 wherein said class 2 accelerator is 2,4-pentanedione or 1-(4-methoxyphenyl)-3-(4-tert-butylphenyl)propane-1,3-dione.

13. The composition according to claim 3 wherein said accelerator is said class 1 compound and said salt is selected from the group consisting of bis-(eta$^6$-arene)iron complex cations, bis(eta$^5$-cyclopentadienyl)iron complex cations, and (eta-5-cyclopentadienyl)iron arene complex cations.

14. The cured composition according to claim 3.

15. The cured composition according to claim 4.

16. A process comprising the steps:
a) providing the curable composition according to claim 3, and
b) adding sufficient energy to the composition in the form of at least one of heat and light, in any combination and order, to cure said composition.

17. A process comprising the steps:
a) coating at least one surface of a substrate with a layer of the curable composition according to claim 3, and b) supplying sufficient energy to the composition in the form of at least one of heat and light, in any combination and order, for a time sufficient to cure said composition.

18. An article comprising a substrate having on at least one surface thereof a layer of the composition according to claim 3.

19. The article according to claim 18 further comprising a thermoplastic resin.

20. The article according to claim 18 wherein said layer of composition is an adhesive.

21. The article according to claim 20 wherein said adhesive is electrically conductive.

22. The article according to claim 18 wherein said layer of composition is a magnetic medium.

23. An article comprising a substrate having on at least one surface thereof a layer of the composition according to claim 14.

24. The article according to claim 23 wherein said layer of composition is a protective coating.

25. A composition of matter comprising
(1) at least one salt of an organometallic complex cation, wherein said cation contains at least one carbon atom bonded to a transition metal atom, and
(2) at least one compound, or an active portion thereof, from classes 1 and 2:
wherein
class 1 comprises compounds represented by the following formula

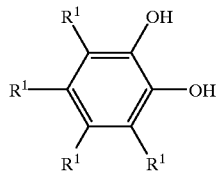

(III)

wherein molecules of Class 1 comprise dihydroxy aromatics wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted and wherein when the molecule contains more than two aromatic hydroxy groups, at least two of the hydroxy groups must be adjacent to each other, and class 2 comprises compounds represented by the following formula

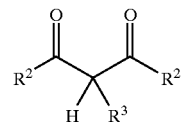

(IV)

wherein molecules of Class 2 comprise those compounds having a β-diketone moiety wherein each $R^2$ can be the same or different and, excluding hydrogen, can be the same as $R^1$ described for the Class 1 accelerators, and wherein $R^3$ can be a substituted or unsubstituted alkyl or aryl group.

26. The composition of matter of claim 25 wherein said compound is selected from Class 1.

27. The composition of matter of claim 25 wherein said compound is selected from Class 2.

28. The composition of matter of claim 25 wherein said Class 1 compound is selected from the group consisting of catechol, propyl gallate, tannic acid, 2,3,4-trihydroxybenzophenone, and 2,3,4-trihydroxyacetophenone.

29. The composition of matter of claim 25 wherein said Class 2 compound is selected from the group consisting of 2,4pentanedione, 1,3-diphenyl-1,3-propanedione, and 1-(4-methoxyphenyl)-3-(4-tert-butylphenyl)propane-1,3-dione.

* * * * *

UNITED STATES PATENT AND TRADEMARK OFFICE
CERTIFICATE OF CORRECTION

PATENT NO. : 6,265,459 B1
DATED : July 24, 2001
INVENTOR(S) : Wayne Scott Mahoney and Peggy Sperl Willett It is certified that error appears in the above-identified patent and that said Letters Patent is hereby corrected as shown below:

Column 4,
Line 30, "spiro-3,4epoxy)" should read -- spiro-3,4-epoxy) --

Column 5,
Line 10, "VECTOMR" should read -- VECTOMER --
Line 19, "Bifinctional" should read -- Bifunctional --
Line 36, "$(L_2)_ZM$" should read -- $(L^2)_ZM$ --

Column 6,
Line 20, "$eta^6oluene$," should read -- $eta^6$–toluene, --
Lines 50-51, "hydrocarby-lnercapto" should read -- hydrocarbylmercapto --

Column 8,
Line 18, "hexafluoroantinonate," should read -- hexafluoroantimonate, --

Column 10,
Line 66, "cyclohexylnethanol," should read -- cyclohexylmethanol --
Line 67, "2-norboanemethanol," should read -- 2-norbornanemethanol --
Line 67, "tetrahydrofuryl" should read -- tetrahydrofurfuryl --

Column 15,
Line 56, "$CpFeXylShF_6$" should read -- $CpFeXylSbF_6$ --

Column 17,
Line 17, "compositions" should read -- composition --

Column 20,
Line 22, "of EPON" should read -- of an EPON --

Column 22,
Line 29, "adding" should read -- using --

UNITED STATES PATENT AND TRADEMARK OFFICE
CERTIFICATE OF CORRECTION

PATENT NO.   : 6,265,459 B1
DATED        : July 24, 2001
INVENTOR(S)  : Wayne Scott Mahoney and Peggy Sperl Willett It is certified that error appears in the above-identified patent and that said Letters Patent is hereby corrected as shown below:

Column 24,
Line 8, "$(L_2)_ZM$" should read -- $(L^2)_ZM$ --

Signed and Sealed this

Twenty-first Day of January, 2003

JAMES E. ROGAN
*Director of the United States Patent and Trademark Office*